US011670515B2

(12) United States Patent
Huang et al.

(10) Patent No.: US 11,670,515 B2
(45) Date of Patent: *Jun. 6, 2023

(54) CAPACITIVELY COUPLED PLASMA ETCHING APPARATUS

(71) Applicant: Advanced Micro-Fabrication Equipment Inc. China, Shanghai (CN)

(72) Inventors: Yunwen Huang, Shanghai (CN); Tuqiang Ni, Shanghai (CN); Jie Liang, Shanghai (CN); Jinlong Zhao, Shanghai (CN); Lei Wu, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 251 days.

This patent is subject to a terminal disclaimer.

(21) Appl. No.: 16/716,397

(22) Filed: Dec. 16, 2019

(65) Prior Publication Data

US 2020/0194275 A1 Jun. 18, 2020

(30) Foreign Application Priority Data

Dec. 17, 2018 (CN) .......................... 201811543577.1

(51) Int. Cl.
*H01L 21/00* (2006.01)
*H01L 21/311* (2006.01)
(Continued)

(52) U.S. Cl.
CPC .. *H01L 21/31116* (2013.01); *H01J 37/32091* (2013.01); *H01J 37/32532* (2013.01); *H01L 21/67069* (2013.01); *H01J 37/32449* (2013.01)

(58) Field of Classification Search
None
See application file for complete search history.

(56) References Cited

U.S. PATENT DOCUMENTS 5,210,466 A * 5/1993 Collins ................. C23C 16/509
156/345.44
5,348,497 A * 9/1994 Nitescu ............. H01J 37/32577
411/373
(Continued)

FOREIGN PATENT DOCUMENTS

CN 102027574 A 4/2011
CN 102084468 A 6/2011
(Continued)

*Primary Examiner* — Sylvia MacArthur
*Assistant Examiner* — Michelle Crowell
(74) *Attorney, Agent, or Firm* — Womble Bond Dickinson (US) LLP; Joseph Bach, Esq.

(57) ABSTRACT

Disclosed is a capacitively coupled plasma etching apparatus, wherein a lower electrode is fixed to a lower end of an electrically conductive supporting rod, a retractable electrically conductive part is fixed to the lower end of the electrically conductive supporting rod, wherein the retractable electrically conductive part being extended or retracted along an axial direction of the electrically conductive supporting rod; besides, the lower end of the retractable electrically conductive part is electrically connected with the output end of the radio-frequency matcher via an electrically connection portion, and the loop end of the radio-frequency matcher is fixed to the bottom of a chamber body. In this way, the height of the lower electrode may be controlled by extension or retraction of the retractable electrically conductive part, such that the distance between the upper and lower plates becomes adjustable; besides, the loop end of the radio-frequency matcher is fixed to the bottom of the chamber body, such that when the retractable electrically conductive part is axially extended or retracted, the movement of the electrically connection portion in the radial direction of the extractable electrically conductive part is reduced, not causing instability of the radio-frequency loop, thereby (Continued)

achieving stability of the radio-frequency loop while achieving adjustability of the plate distance.

9 Claims, 1 Drawing Sheet

(51) Int. Cl.
  *H01J 37/32* (2006.01)
  *H01L 21/67* (2006.01)

(56) References Cited

U.S. PATENT DOCUMENTS

| | | | |
|---|---|---|---|
| 5,772,833 A | 6/1998 | Inazawa et al. | |
| 6,221,221 B1 * | 4/2001 | Al-Shaikh | H01J 37/32577 |
| | | | 204/298.02 |
| 6,349,670 B1 | 2/2002 | Nakano et al. | |
| 6,673,196 B1 | 1/2004 | Oyabu | |
| 7,186,315 B2 | 3/2007 | Himori et al. | |
| 8,485,128 B2 * | 7/2013 | Kellogg | H01L 21/6719 |
| | | | 118/723 I |
| 8,522,716 B2 | 9/2013 | Kadkhodayan et al. | |
| 8,552,334 B2 | 10/2013 | Tappan et al. | |
| 9,524,876 B2 | 12/2016 | Hisamatsu et al. | |
| 9,799,542 B2 | 10/2017 | Sugawara | |
| 9,991,096 B2 | 6/2018 | Haga | |
| 2002/0148565 A1 * | 10/2002 | Schneider | H01L 21/68792 |
| | | | 118/728 |
| 2005/0014372 A1 | 1/2005 | Shimonishi et al. | |
| 2006/0021701 A1 | 2/2006 | Tobe et al. | |
| 2006/0102210 A1 * | 5/2006 | Chouno | H01L 21/67748 |
| | | | 134/186 |
| 2007/0186857 A1 | 8/2007 | Kim et al. | |
| 2008/0274297 A1 | 11/2008 | Furuta et al. | |
| 2009/0200268 A1 | 8/2009 | Tappan et al. | |
| 2011/0100552 A1 * | 5/2011 | Dhindsa | H01J 37/32642 |
| | | | 156/345.1 |
| 2013/0128409 A1 | 5/2013 | Nam et al. | |
| 2014/0127911 A1 | 5/2014 | Shih et al. | |
| 2015/0083042 A1 * | 3/2015 | Kobayashi | H01J 37/32082 |
| | | | 118/500 |
| 2016/0240426 A1 * | 8/2016 | Kamath | H01J 37/32082 |
| 2017/0365449 A1 | 12/2017 | Cui et al. | |
| 2019/0024234 A1 * | 1/2019 | Kamio | C23C 16/45544 |
| 2019/0074200 A1 * | 3/2019 | Fukusumi | H01L 21/67017 |
| 2019/0341231 A1 * | 11/2019 | Weichart | C23C 16/4558 |
| 2020/0194230 A1 * | 6/2020 | Huang | H01L 21/68792 |
| 2020/0194276 A1 * | 6/2020 | Huang | H01L 21/31116 |
| 2022/0384157 A1 * | 12/2022 | Wang | H01J 37/32642 |

FOREIGN PATENT DOCUMENTS

| | | | |
|---|---|---|---|
| JP | 2000286242 A * | 10/2000 | H01L 21/3065 |
| JP | 4504684 B2 | 7/2010 | |
| KR | 100724571 B1 | 6/2007 | |
| TW | 200913002 A | 3/2009 | |
| TW | 201301428 A | 1/2013 | |
| TW | 201344771 A | 11/2013 | |
| TW | 201506978 A | 2/2015 | |
| TW | 201606850 A | 2/2016 | |
| TW | 201843697 A | 12/2018 | |

* cited by examiner

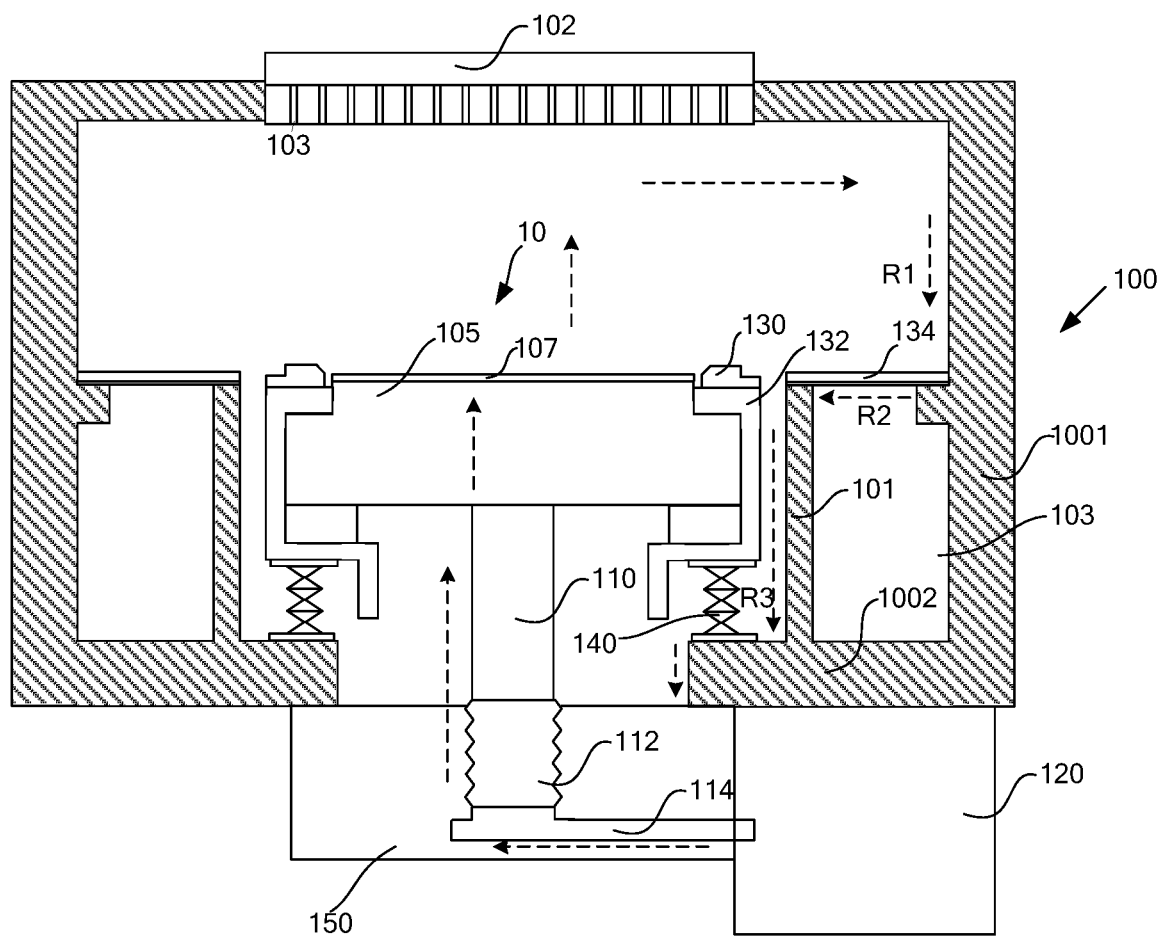

CAPACITIVELY COUPLED PLASMA ETCHING APPARATUS

RELATED APPLICATION

This application claims priority benefit from Chinese Patent Application No. 201811543577.1 filed Dec. 17, 2018, the disclosure of which is hereby incorporated herein by reference in its entirety.

FIELD

The present disclosure relates to semiconductor processing apparatus, and more particularly relates to a capacitively coupled plasma etching apparatus

BACKGROUND

A capacitively couple plasma processing apparatus refers to an apparatus which generates plasma by radio frequency coupled discharging and then utilizes the plasma to perform processes such as deposition and etching, wherein the plate distance between plasma-generating electrodes is a critical parameter; particularly, with the ever higher requirements on processes of a plasma etching apparatus, it is needed to implement different etching steps under different plate distances. However, the plate distance in existing plasma etching apparatus is fixed and non-adjustable; in addition, because the electrodes further serve as part of a radio-frequency loop, stability of the radio-frequency loop should be taken into consideration in order to achieve adjustability of the plate distance.

SUMMARY

In view of the above, an objective of the present disclosure is to provide a capacitively coupled plasma etching apparatus, which may achieve adjustability of plate distance between electrodes while maintaining radio-frequency loop stability.

To achieve the objective, the present disclosure provides a technical solution below:

a capacitively coupled plasma etching apparatus, comprising:

a chamber body;

an upper electrode disposed in the chamber body;

a base disposed in the chamber body and arranged opposite to the upper electrode, the base comprising a lower electrode, the lower electrode being fixed to an electrically conductive supporting rod;

a retractable electrically conductive part fixed to a lower end of the electrically conductive supporting rod, the retractable electrically conductive part being extended or retracted in the axial direction of the electrically conductive supporting rod; and an electrical connection part securely connected between the lower end of the retractable electrically conductive part and an output end of a radio-frequency matcher, wherein a loop end of the radio frequency matcher is fixed at the bottom of the chamber body.

Optionally, the axis of the retractable electrically conductive part overlaps with the axis of the electrically conductive supporting rod.

Optionally, the chamber body comprises a side wall and a bottom wall, the bottom wall having an opening, the lower electrode being disposed above the opening; the chamber body further comprising:

a retractable sealing part, two ends of which are fixed to the base and the bottom wall, respectively; via the retractable sealing part, an upper surface of the lower electrode is hermetically disposed in an accommodation space where the chamber body is accommodated, the retractable sealing part being extended or retracted in the axial direction of the electrically conductive supporting rod.

Optionally, the base further comprises a dielectric ring, a gap being provided between the dielectric ring and the side wall, the dielectric ring being configured for electrical isolation between the lower electrode and the chamber body, the base being fixed to the retractable sealing part via the dielectric ring, and the upper surface of the lower electrode being hermetically disposed in the accommodation space where the chamber body is accommodated via the dielectric ring and the retractable sealing part.

Optionally, an electrostatic chuck is provided on the lower electrode, the dielectric ring surrounding the side wall of the lower electrode, and a focus ring surrounding the electrostatic chuck is further provided on the dielectric ring.

Optionally, the retractable sealing part is a bellow seal.

Optionally, the apparatus further comprises a grounding ring, wherein the chamber body comprises a side wall and a bottom wall, the grounding ring being disposed on the bottom wall of the chamber body; a cavity is provided between the grounding ring and the side wall, a plasma confinement ring is provided above the cavity, the plasma confinement ring and the cavity forming an exhaust cavity body, and the plasma confinement ring comprises an electrically conductive member;

path of the radio-frequency power of the capacitively coupled plasma etching apparatus is as such: after the radio frequency power outputted by the output end of the radio frequency matcher enters the lower electrode, it passes through the plasma above the lower electrode, and then returns, through a return path, to the loop end of the radio-frequency matcher, wherein the return path includes a first flow path along the inner side of the upper portion of the side wall, the second flow path disposed in the lower surface of the confinement ring, and a third flow path along the grounding ring, wherein the first flow path, the second flow path, and the third flow path are sequentially connected.

The number of the radio-frequency matcher is one or plural, a plurality of radio-frequency matchers having different frequencies and powers.

Optionally, one or more radio frequency shield covers are further provided outside the electrically conductive supporting rod, the retractable electrically conductive part, and the electrical connection part.

Optionally, the electrical connection part comprises a transverse portion in a radial direction of the retractable electrically conductive part, and the transverse portion is a rigid connection part.

In the capacitively coupled plasma etching apparatus provided in the embodiments of the present disclosure, the lower electrode is fixed to the lower end of the electrically conductive supporting rod, the retractable electrically conductive part is fixed to the lower end of the electrically conductive supporting rod, wherein the retractable electrically conductive part being extended or retracted in an axial direction of the electrically conductive supporting rod; besides, the lower end of the retractable electrically conductive part is electrically connected with the output end of the radio-frequency matcher via the electrically connection part, and the loop end of the radio-frequency matcher is fixed to the bottom of the chamber body. In this way, the height of the lower electrode may be controlled by extension and retraction of the retractable electrically conductive part, making the distance between the upper and lower plates adjustable; besides, the loop end of the radio-frequency matcher is fixed to the bottom of the chamber body, such that when the retractable electrically conductive part is axially extended or retracted, movement of the electrically connection portion in the radial direction of the retractable electrically conductive part is reduced, not causing instability of the radio-frequency loop, thereby achieving stability of the radio-frequency loop while achieving adjustability of the plate distance.

BRIEF DESCRIPTION OF THE DRAWINGS

To elucidate the technical solutions of the present disclosure or the prior art, the drawings used in describing the embodiments of the present disclosure or the prior art will be briefly introduced below. It is apparent that the drawings as described only relate to some embodiments of the present disclosure. To those skilled in the art, other drawings may be derived based on these drawings without exercise of inventive work, wherein:

FIG. 1 illustrates a sectional structural schematic diagram of a capacitively coupled plasma etching apparatus according to the embodiments of the present disclosure.

DETAILED DESCRIPTION OF EMBODIMENTS

To make the objectives, technical solutions, and advantages of the present disclosure much clearer, the preferred embodiments of the present disclosure will be described in detail with reference to the accompanying drawings of the embodiments of the present disclosure.

In the description below, many details are illustrated to facilitate understanding the present disclosure more comprehensively. However, the present disclosure may also be implemented adopting other manners different from what are described herein. Without going against the idea of the present disclosure, those skilled in the art may make similar extensions. Therefore, the present disclosure is not limited to the preferred embodiments disclosed hereinafter.

FIG. 1 shows a sectional structure schematic diagram of a capacitively coupled plasma etching apparatus according to an embodiment of the present disclosure. The plasma etching apparatus has a processing chamber, wherein the processing chamber is a hermetically sealed space enclosed by a chamber body 100 and other essential components, such that a wafer may completely undergo an etching process in the vacuum environment of the processing chamber.

In the chamber body 100, an upper electrode 102 and a base 10 arranged opposite to the upper electrode 102 are disposed; the base 10 comprises a lower electrode 105, the lower electrode 105 being fixed to an electrically conductive supporting rod 110; a lower end of the electrically conductive supporting rod 110 is fixed on a retractable electrically conductive part 112; an electrical connection part 114 is securely connected between the lower end of the retractable electrically conductive part 112 and an output end of a radio frequency matcher 120; and a loop end of the radio frequency matcher 120 is fixed at the bottom of the chamber body 100.

The upper electrode 102 is an electrode disposed at the upper part of the chamber body 100; generally, the upper electrode 102 is also referred to as a showerhead; an air inlet (not shown) is generally provided on an end face of the upper electrode 102 outside the processing chamber, and a vent hole 103 is generally provided on an end face inside the processing chamber; the process gas enters the upper electrode 102 via the air inlet and is transmitted into the processing chamber via the vent hole 103.

The lower electrode 105 is connected to the output end of the radio-frequency match er 120 sequentially through the electrically conductive supporting rod 110, the retractable electrically conductive part 112, and the electrical connection part 114; the radio-frequency matcher 120 is connected to the radio-frequency power supply (not shown) so as to supply the radio-frequency power to the lower electrode 105.

In some embodiments, the lower electrode 105 may be connected to one or more radio-frequency matcher 120, e.g., 2 radio-frequency matchers. In an embodiment wherein the lower electrode 105 is connected to a plurality of radio-frequency matchers, each radio-frequency matcher may supply a radio frequency and power different from those supplied by other radio-frequency matchers so as to be adapted to the requirements of different processes. In such embodiments, the upper electrode 102 may be grounded. In some other embodiments, the lower electrode 105 may be connected to a radio-frequency matcher, and the upper electrode may be connected to another radio-frequency matcher; these two radio-frequency matchers may supply different frequencies and powers.

The lower electrode 105 may further serve as a support structure for the wafer. A temperature control device (not shown) may be disposed in the lower electrode or in a dielectric material layer above the lower electrode, for providing an appropriate temperature to the wafer; the temperature control device may be a joule heat device, e.g., implementing temperature control via resistance; it may also be a heat conduction passage, e.g., implementing temperature control via the coolant in the heat conduction passage; temperature control devices may be arranged by partition, such that the temperatures of different regions of the wafer may be separately controlled, thereby implementing uniform temperature control.

An electrostatic chuck (ESC) 107 may be further provided on the lower electrode 105, for adsorbing the wafer; the electrostatic chuck 107 may be disposed in the dielectric material layer; the dielectric material, for example, may be a ceramic material.

In an embodiment of the present disclosure, the lower electrode 105 is connected to a radio frequency source, serving as a radio-frequency power output end; the upper electrode 102 and the chamber body 100 may be grounded; the chamber body 100, or the chamber body and some other accessories electrically connected to the chamber body, may serve as a return path for the radio-frequency power. Specifically, the radio-frequency power is outputted from the output end of the radio-frequency matcher 120, and after sequentially passing through the electrical connection part 114, the retractable electrically conductive part 112, and the electrically conductive supporting rod 110, enters the lower electrode 105; after the process gas is introduced into the chamber body 100 via the upper electrode 102, in the action of the radio-frequency power, plasma is generated in the space between the upper electrode 102 and the lower electrode 105, i.e., in the space above the lower electrode 105; the radio-frequency power returns to the loop end of the radio-frequency matcher through the return path in the chamber body 100; dependent on different chamber body structures and different design requirements, the return path may be configured differently.

The lower electrode 105 is securely supported by the electrically conductive supporting rod 110; the electrically conductive supporting rod 110 is fixed on the retractable electrically conductive part 112; the electrically conductive supporting rod 110 and the retractable electrically conductive part 112 are both made of an electrically conductive material, which may be of a solid or hollow structure; driven by a drive device (not shown), the retractable electrically conductive part 112 may be axially extended or retracted along the electrically conductive supporting rod, further driving the lower electrode 105 to move up and down, thereby enabling adjustment of the spacing between the lower electrode 105 and the upper electrode 102. In some embodiments, the retractable electrically conductive part may be an electrically conductive bellow or a telescope electrically conductive shaft, etc.; further, the axis of the retractable electrically conductive part 112 overlaps with the axis of the electrically conductive supporting rod 110. In this way, when the retractable electrically conductive part 112 is being extended or retracted, the distribution of the radio-frequency power is relatively stable, thereby enhancing stability of the radio-frequency power.

The radio-frequency matcher 120, which is connected to a radio frequency source, is configured for outputting a desired radio-frequency power; the radio-frequency matcher 120 has an output end and a loop end, wherein the output end is configured for outputting a radio frequency, and the loop end is configured for receiving the returned radio frequency. Particularly, the loop end of the radio-frequency matcher 120 is securely connected to the bottom of the chamber body 100; one end of the electrically connection part 114 is fixed to the output end of the radio-frequency matcher 120, and the other end thereof is fixedly connected to the lower end of the retractable electrically conductive part 112; the electrically conductive part 114 is made of an electrically conductive material, which conveys the radio frequency power outputted from the radio frequency matcher 120 to the retractable electrically conductive part 112 and further conveys the radio frequency power to the lower electrode 105. In this way, the radio frequency matcher 120 is fixedly connected to thereby fix one end of the electrical connection part 114, and the other end thereof only moves with the retractable electrically conductive part 112 in the axial direction of the electrically conductive supporting part 110; the axial movement has little impact on radio-frequency power distribution and will not cause instability of the radio-frequency power.

In a more preferred embodiment, as shown in FIG. 1, the electrical connection part 114 includes a transverse portion in the radial direction of the retractable electrically conductive part; moreover, the transverse portion is a rigid connection part, i.e., the transverse portion does not have an adaptive displacement as the retractable electrically conductive part 112 moves.

The processing chamber of the plasma etching apparatus is a hermetically sealed space enclosed by the chamber body 100 and other essential components, such that the wafer may completely undergo the etching process in the vacuum environment of the processing chamber. In the present disclosure, an upper electrode 102 is disposed at the top of the chamber body 100; the upper electrode 102 may be disposed inside the chamber body 100, implementing sealing of the top of the chamber body 100 through other members, such as an upper cover plate; the upper electrode 102 may optionally be inlaid in the top of the chamber body 100. Here, the dispositions of the upper electrode are only exemplary, and the present disclosure has no limitation on disposition of the upper electrode 102 and sealing of the top of the chamber body 100.

In an embodiment of the present disclosure, the chamber body 100 comprises a side wall 1001 and a bottom wall 1002; the lower electrode 105 is disposed above an opening, such that the electrically conductive supporting rod 110 and the retractable electrically conductive part 112 may move up and down at the opening position. A retractable sealing part 140 is fixedly connected between the base 10 and the bottom wall 1002; the retractable sealing part 140 is made of a dielectric material, e.g., a bellow seal, i.e., a bellow for the purpose of sealing; the retractable sealing part 140 is configured for sealing the upper surface of the lower electrode 105 in the accommodation space where the chamber body 100 is accommodated; besides, the retractable sealing part 140 is extended or retracted in the axial direction of the electrically conductive supporting rod 110; in other words, the retractable direction of the retractable sealing part 140 is the same as that of the retractable electrically conductive part 112; here, the upper surface of the lower electrode 105 refers to the surface facing the upper electrode 102. In this way, when the retractable electrically conductive part 112 is driven to be telescoped, the retractable sealing part 140 will be extended or retracted along with the lower electrode; besides, the lower electrode 105 may be sealed inside the chamber body 100 via the retractable sealing part 140. It can be understood that the retractable sealing part 140 can be directly or indirectly fixed with the lower electrode; when the base further includes other components, the retractable sealing part 140 may cooperate with other components to implement sealing of the bottom of the chamber body, such that the surface of the lower electrode 105 facing the upper electrode 102 is disposed in the hermetically sealed chamber.

In some embodiments of the present disclosure, the base 10 further comprises a dielectric ring 132; the dielectric ring 132 may be fixed to the lower electrode 105; the dielectric ring 132 is made of a dielectric material, e.g., a ceramic material; a gap is provided between the dielectric ring 132 and the side wall 1001; the dielectric ring 132 is configured for electrical isolation between the lower electrode 105 and the chamber body 100; in this way, the lower electrode 105 is fixed to the retractable sealing part 140 via the dielectric ring 132; with the dielectric ring 132 and the retractable sealing part 140, the upper surface of the lower electrode 105 is hermetically disposed in the accommodation space where the chamber body 100 is accommodated. In this example, as shown in FIG. 1, the hermetical space in the lower portion of the chamber body 100 is enclosed by the side wall 1001 and the bottom wall 1002, the inner wall of the retractable sealing part 140, and the side wall of the dielectric ring 132, such that the upper surface of the lower electrode 105 is disposed in the chamber body 100, while the lower surface of the lower electrode 105, the electrically conductive supporting rod 110, and the retractable electrically conductive part 112 are disposed outside the chamber body 100; a vacuum environment is provided in the chamber body 100 for etching process.

The dielectric ring 132 may be set upon specific needs. In a specific example, as shown in FIG. 1, the central region of the lower electrode 105 is higher than the edge region; the central region is for supporting the wafer, which has a shape and a size substantially identical to the wafer; the electrostatic chuck 107 is disposed above the central region; the dielectric ring 132 surrounds the edge region, the edge of the lower electrode 105, and the lower portion region of the lower electrode 105, and extends till to the outer side of the retractable sealing part 140.

Moreover, a focus ring 130 surrounding the electrostatic chuck 107 is further provided on the dielectric ring 132; the focus ring 130 is configured for preventing arc discharge. In the specific example, as shown in FIG. 1, the focus ring 105 has a flared oblique face proximate to the upper portion of the inner wall of the electrostatic chuck 107; an outer edge of the focus ring 130 proximal to the electrostatic chuck 107 is a recessed region the recessed region being adaptable for disposing an edge ring (not shown).

In an embodiment of the present disclosure, the chamber body 100 is made of a conductor material; the chamber body 100 also serves as a return path for radio-frequency power, such that the radio-frequency power returns to the loop end of the radio-frequency matcher through the return path in the chamber body 100. In some specific embodiments, the capacitively coupled plasma etching apparatus further comprises a grounding ring 101 and a plasma confinement ring 134 disposed in the middle of the side wall 1001 of the chamber body 100; the plasma confinement ring 134 is a laminated structure, comprising a lower electrically conductive part and an upper dielectric material layer from bottom to top; a cavity 103 is provided between the grounding ring 101 and the side wall 1001; a plasma confinement ring 134 is disposed above the cavity 103; the plasma confinement ring 134 and the cavity 103 form an exhaust cavity for discharging exhaust gas. Particularly, the grounding ring 101 is an isolation wall which is electrically conductive. On one hand, the grounding ring 101 may serve as a radio frequency return path; on the other hand, it transversely isolates out a space for the exhaust cavity; the plasma confinement ring 134 is an air permeated structure, so as to quench the extra plasma inside the chamber body and cause the exhaust gas to enter the exhaust cavity; the exhaust cavity is generally further provided with an air pump, via which the exhaust gas in the chamber is pumped out.

In this embodiment, as shown in FIG. 1, the return path in the chamber body 100 includes a first flow path R1 along the inner side of the upper portion of the side wall 1001 of the chamber body, a second flow path R2 disposed in the lower surface of the confinement ring, and a third flow path R3 along the grounding ring 101, wherein the first flow path R1, the second flow path R2, and the third flow path R3 are sequentially connected; further, the radio frequency power returns to the loop end of the radio frequency matcher 120 via the bottom wall 1002 of the chamber body. In this way, in the embodiment, the radio frequency directly returns to the return end of the radio frequency matcher via the radio frequency flow paths inside the chamber body, thereby effectively shortening the radio frequency path.

Besides, the electrically conductive supporting rod 110, the retractable electrically conductive part 112, the electrical connection part 11, and the chamber body 100 all have radio frequency radiations, and thus a radio frequency shield cover may be provided outside them; based on the connections between them, radio frequency shielding may be implemented by one or more radio frequency shield covers. In this example, as shown in FIG. 1, radiation shielding may be implemented by the radio frequency shield cover (not shown) of the chamber body 100, and the radio frequency shield covers 150 outside the retractable electrically conductive part 112 and the electrical connection part 11.

What have been described above are only preferred embodiments of the present disclosure. Although the present disclosure has been described with preferred embodiments, such preferred embodiments are not intended to limit the present disclosure. Any skilled in the art may make various possible alternations and modifications to the technical solution of the present disclosure using the method and technical content revealed above without departing from the scope of the present disclosure, or modify them as equivalent embodiments. Therefore, any simple alternations, equivalent changes and modifications to the above embodiments based on the substance of the present disclosure without departing from the contents of the technical solution of the present disclosure still fall within the protection scope of the present disclosure.

We claim:

1. A capacitively coupled plasma etching apparatus, comprising:
    a chamber body;
    an upper electrode disposed in the chamber body;
    a base disposed in the chamber body and arranged opposite to the upper electrode, the base comprising a lower electrode, the lower electrode being fixed to an electrically conductive supporting rod;
    a retractable dielectric sealing part configured for sealing an accommodation space wherein the lower electrode is disposed;
    a retractable electrically conductive part fixed to a lower end of the electrically conductive supporting rod, the retractable electrically conductive part being extended or retracted in the axial direction of the electrically conductive supporting rod; and
    an electrical connection part securely connected between the lower end of the retractable electrically conductive part and an output end of a radio frequency matcher, a loop end of the radio frequency matcher being fixed at the bottom of the chamber body;
    the base further comprises a dielectric ring, a gap being provided between the dielectric ring and a grounding ring, the dielectric ring being configured for electrical isolation between the lower electrode and the chamber body, the retractable dielectric sealing part being attached to the dielectric ring;
    wherein when the retractable electrically conductive part is driven to be telescoped, the retractable sealing part extended or retracted along with the lower electrode.

2. The apparatus according to claim 1, wherein the axis of the retractable electrically conductive part overlaps with the axis of the electrically conductive supporting rod.

3. The apparatus according to claim 1, wherein the chamber body comprises a side wall and a bottom wall, the bottom wall having an opening, the lower electrode being disposed above the opening; the apparatus wherein:
    two ends of the retractable sealing part are fixed to the base and the bottom wall, respectively; via the retractable sealing part, an upper surface of the lower electrode is hermetically disposed in an accommodation space where the chamber body is accommodated, the retractable sealing part being extended or retracted in the axial direction of the electrically conductive supporting rod.

4. The apparatus according to claim 1, wherein an electrostatic chuck is provided on the lower electrode, the dielectric ring surrounding the side wall of the lower electrode, and a focus ring surrounding the electrostatic chuck is further provided on the dielectric ring.

5. The apparatus according to claim 3, wherein the retractable sealing part is a bellow seal.

6. The apparatus according to claim 1, wherein the chamber body comprises a side wall and a bottom wall, the grounding ring being disposed on the bottom wall of the chamber body; a cavity is provided between the grounding ring and the side wall; a plasma confinement ring is provided above the cavity, the plasma confinement ring and the cavity forming an exhaust cavity; and the plasma confinement ring comprises an electrically conductive member;

path of the radio-frequency power of the apparatus is as such: after the radio frequency power outputted from the output end of the radio frequency matcher enters the lower electrode, it passes through the plasma above the lower electrode, and then returns, through a return path, to the loop end of the radio-frequency matcher, wherein the return path includes a first flow path along the inner side of the upper portion of the side wall, the second flow path disposed in the lower surface of the confinement ring, and a third flow path along the grounding ring, wherein the first flow path, the second flow path, and the third flow path are sequentially connected.

7. The apparatus according to claim 1, wherein the number of the radio-frequency matcher is one or plural, a plurality of radio-frequency matchers having different frequencies and powers.

8. The apparatus according to claim 1, wherein one or more radio frequency shield covers are further provided outside the electrically conductive supporting rod, the retractable electrically conductive part, and the electrical connection part.

9. The apparatus according to claim 1, wherein the electrical connection part comprises a transverse portion in a radial direction of the retractable electrically conductive part, and the transverse portion is a rigid connection part.

\* \* \* \* \*